(12) United States Patent
Li et al.

(10) Patent No.: US 9,093,453 B2
(45) Date of Patent: Jul. 28, 2015

(54) HIGH PERFORMANCE E-FUSE FABRICATED WITH SUB-LITHOGRAPHIC DIMENSION

(71) Applicant: International Business Machines Corporation, Armonk, NY (US)

(72) Inventors: Junjun Li, Williston, VT (US); Yan Zun Li, Lagrangeville, NY (US); Chengwen Pei, Danbury, CT (US); Pinping Sun, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 14/047,638

(22) Filed: Oct. 7, 2013

(65) Prior Publication Data
US 2015/0097266 A1    Apr. 9, 2015

(51) Int. Cl.
| | |
|---|---|
| *H01L 23/52* | (2006.01) |
| *H01L 23/525* | (2006.01) |
| *H01L 21/768* | (2006.01) |
| *H01L 23/62* | (2006.01) |

(52) U.S. Cl.
CPC ........ *H01L 23/5256* (2013.01); *H01L 21/7684* (2013.01); *H01L 21/76877* (2013.01); *H01L 23/62* (2013.01)

(58) Field of Classification Search
CPC ............................ H01L 23/5256; H01L 23/62
USPC .................. 438/132, 215; 257/209, E23.149
See application file for complete search history.

(56) References Cited

U.S. PATENT DOCUMENTS

| | | | |
|---|---|---|---|
| 4,740,485 A | | 4/1988 | Sharpe-Geisler |
| 5,854,510 A | * | 12/1998 | Sur et al. ........................ 257/529 |
| 6,921,970 B2 | | 7/2005 | Shiomi et al. |
| 7,651,893 B2 | | 1/2010 | Chen et al. |
| 8,012,821 B2 | | 9/2011 | Ryou et al. |
| 8,035,191 B2 | | 10/2011 | Lin et al. |
| 8,053,809 B2 | | 11/2011 | Cheng et al. |
| 8,395,192 B2 | | 3/2013 | Breitwisch et al. |
| 2003/0090257 A1 | | 5/2003 | Howes |
| 2008/0217735 A1 | | 9/2008 | Chen et al. |
| 2010/0109122 A1 | | 5/2010 | Ding et al. |
| 2010/0320561 A1 | * | 12/2010 | Xia et al. ....................... 257/529 |
| 2012/0164799 A1 | * | 6/2012 | Kurz et al. .................... 438/132 |
| 2013/0008234 A1 | | 1/2013 | Vince |
| 2013/0105895 A1 | * | 5/2013 | Liang et al. ................... 257/347 |

FOREIGN PATENT DOCUMENTS

WO    W02005029582 A1    3/2005

OTHER PUBLICATIONS

Tonti, W.R., et al.—Reliability and Design Qualification of a Sub-Micron Tungsten Silicide E-Fuse—IEEE 04ch37533—42nd Annual International Reliability Physics Symposium, Phoenix, 2004.

* cited by examiner

*Primary Examiner* — Kimberly Rizkallah
*Assistant Examiner* — Maria Ligai
(74) *Attorney, Agent, or Firm* — Catherine Ivers

(57) ABSTRACT

An electronic fuse link with lower programming current for high performance and self-aligned methods of forming the same. The invention provides a horizontal e-fuse structure in the middle of the line. A reduced fuse link width is achieved by spacers on sides of pair of dummy or active gates, to create sub-lithographic dimension between gates with spacers to confine a fuse link. A reduced height in the third dimension on the fuse link achieved by etching the link, thereby creating a fuse link having a sub-lithographic size in all dimensions. The fuse link is formed over an isolation region to enhanced heating and aid fuse blow.

14 Claims, 17 Drawing Sheets

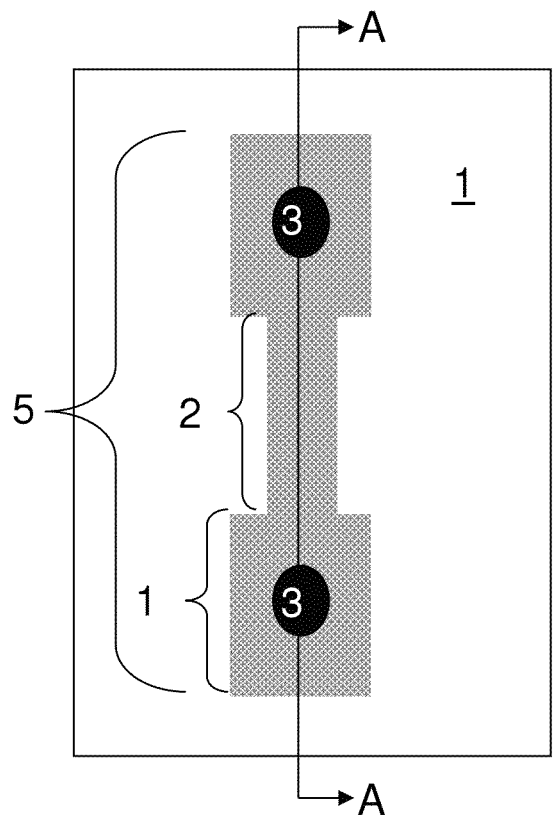
Fig. 1A – *Prior Art*
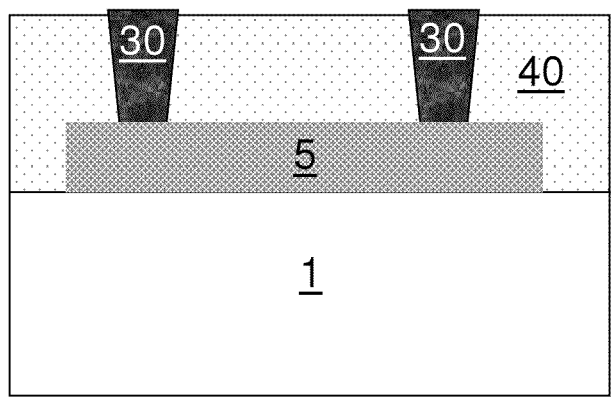
Fig. 1B – *Prior Art*

HIGH PERFORMANCE E-FUSE FABRICATED WITH SUB-LITHOGRAPHIC DIMENSION

BACKGROUND OF THE INVENTION

1. Field of the Invention

The present invention generally relates sub-lithographic semiconductor structures, and in particular, conductors which may be used as electrical fuses and methods of making the same.

2. Description of Related Art

In the semiconductor industry, fuses are used in integrated circuits (ICs) for improving manufacturing yield or customizing generic integrated circuits. A fuse can be disconnected (known as "blowing a fuse") (1) by passing an electric current so that electromigration takes place which either causes an open in the fuse element or increases the resistance, or (2) by applying a laser to melt the fuse. A fuse blown by electric current is referred to as an electrical fuse (e-fuse). After blowing the fuse, it is considered programmed.

E-fuses can have one of two orientations, horizontal or vertical. When viewed from top down, a horizontal e-fuse typically includes a line having two wide pad areas at either end with a thinner link in between and connecting the pad areas of the line. The wide pads are to make connections which provide current. The entire fuse including the link is parallel to the substrate, thus a horizontal fuse. A horizontal fuse is typically made of polysilicon and a silicide and found on and in direct contact with the substrate, thus in the front end of line (FEOL) of an IC. A horizontal orientation of the fuse consumes valuable real estate on the chip. Furthermore, as ICs fabrication moves to replacement metal gate processes or FinFET configurations, fabrication of e-fuses in the FEOL becomes difficult to integrate.

Therefore, a reliable fuse that minimizes real estate and is compatible with replacement metal gate and finFET integration is needed.

BRIEF SUMMARY OF THE INVENTION

An object of the invention is to make an e-fuse which is self-aligned and sub-lithographic.

An object of the invention is to provide an e-fuse structure which provides reliable, low current programming. This object may be achieved through reduced fuse link width (preferably a sub-lithographic width), a reduced fuse link height compared to other middle of the line conductors, and by enhanced heating achieved by placing the fuse link over an isolation region of the substrate and between dielectric spacers.

An object of the invention is to provide an e-fuse which can be made simultaneously with typical middle of the line processing using compatible materials, for example refractory metals.

An object of the invention is to provide an e-fuse which can be made having a reduced foot print such that it does not use valuable chip real estate.

Other characteristics and advantages of the invention will become obvious in combination with the description of accompanying drawings, wherein the same number represents the same or similar parts in all figures.

BRIEF DESCRIPTION OF THE DRAWINGS

FIG. 1A illustrates a top down view of a substrate having a traditional horizontal e-fuse;

FIG. 1B illustrates a cross-section through the e-fuse of FIG. 1A along line A-A;

DETAILED DESCRIPTION OF THE INVENTION

Figure 2A:
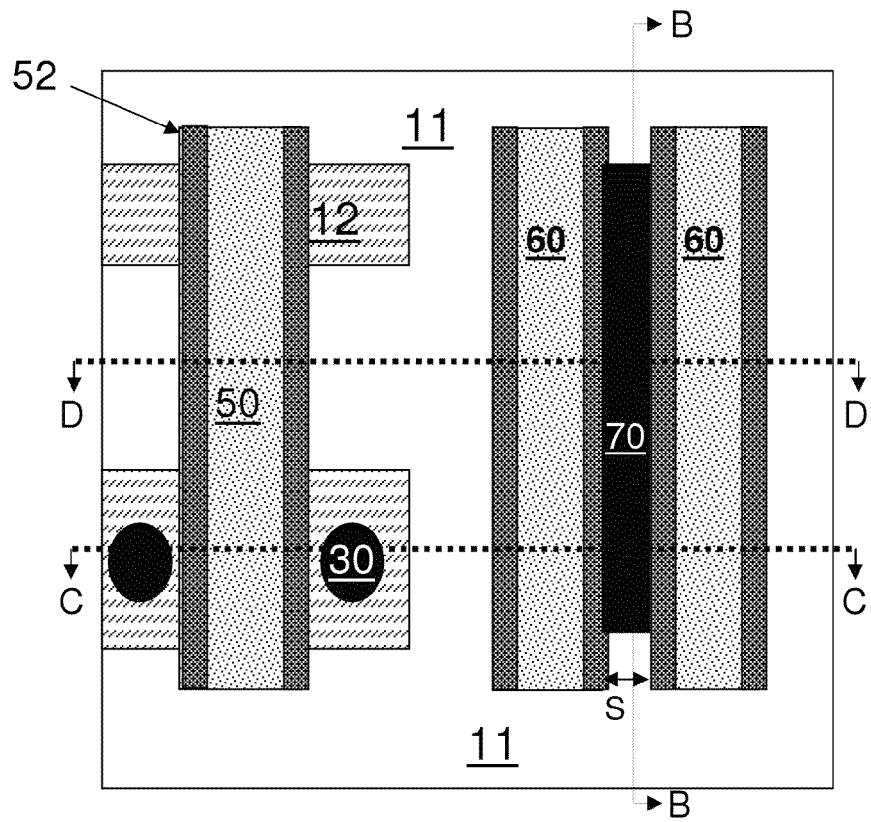
FIG. 2A illustrates a top down view of a substrate having a device area and an e-fuse according to an embodiment of the present invention.

The basic invention includes a horizontal e-fuse having self-aligned, sub-lithographic dimension and a thinned fuse link over an isolation region. The basic structure will be described generally in conjunction with FIGS. 2A through 2D. Other embodiments of the structure will be described in conjunction with FIGS. 3A through 3D and FIGS. 11A-11D. The invention further includes a method of making a self-aligned e-fuse which will be described in conjunction with FIGS. 4A-10B. A detailed description of the invention is made in combination with the following embodiments.

Structure

To better differentiate an embodiment of the e-fuse of the present invention with known FEOL e-fuses, FIG. 1A illustrates a top down view of a known typical FEOL horizontal e-fuse. A typical horizontal e-fuse 5 sits directly on a semiconductor substrate 10 and comprises pad portions 15 which are wider than the link portion 25. A separate contact 30 connects the pads 15 of the e-fuse with circuitry that provides the current to blow the fuse. As mentioned earlier, typical FEOL horizontal e-fuses 5 are made from polysilicon or polysilicon and a silicide. However, the contact 30 is typically made of a different material, such as tungsten.

FIG. 1B is a cross-section of FIG. 1A through line A-A. From this view it is clear that the e-fuse 5 sits directly on the substrate 10. Furthermore, the wide pads 15 or link 25 portions of the typical e-fuse 5 are indistinguishable in this view because they are the same height. From this view, the only indication that there is a wide pad 15 is that the contacts 30 land on those areas of the e-fuse. Here, in this view, the middle of the line (MOL) dielectric layer 40 is shown surrounding the e-fuse 5 and contacts 30. Typically, middle of the line dielectric layers 40 include a doped oxide in which the dopant serves to getter contaminants to protect the front end of line devices (transistors) made in and on the substrate. Common examples of such dopants are phosphorus (P) and boron (B). Therefore, typical middle of the line dielectrics includes the following doped silicate glasses: BSG, PSG and BPSG. The MOL dielectric layer 40 may also be a combination of dielectric layers including doped oxides, undoped oxides or silicon nitrides.

An embodiment of the present invention is illustrated top down and in cross sections as shown in FIGS. 2A through 2D.

Referring to FIG. 2A, a substrate has active areas 12 and isolation areas 11. Active areas 12 are those areas comprising a semiconductor and upon which devices such as transistors are formed. Isolation areas 11 comprise insulating material which separates active areas from each other. On the left hand side of FIG. 2A is a device area which has active areas 12, a gate 50, and contacts 30. Here, the contacts reach the active area 12 which may comprise a source and a drain of the transistors. One or more contacts may exist which land on the gate. The gate is flanked by one or more spacers 52. On the right hand side of FIG. 2A is a fuse area. Here, there are a pair of fuse gates 60 flanked by spacers. The fuse gates 60 may be dummy or active gates, but are preferably dummy gates in this embodiment in which the entire integrated fuse 70 is over isolation area 11. The space (S) between the spacers 52 of adjacent fuse gates 60 is preferably sub-lithographic. Sub-lithographic, also called sub-resolution, refers to a feature that is too small to print. Generally, the Rayleigh equation can be used to determine the minimum image size (Wmin) that can be resolved. It is primarily a function of exposure wavelength (lambda) and the numerical aperature (NA) of the optical system. The equation is Wmin=k1×lambda/NA where k1 is a factor allowing for processing limitations such as resist and developer process, toll vibrations, lens aberrations, etc. In addition, there is a clear formula for minimum pitch (center-to-center distance) of adjacent features that can print which is, gratings with pitch<0.5 lambda/NA will not print. In practice, this means for a 32 nm node technology, the space "S" will preferably be less than 20 nm, typically 10-20 nm. For 22 nm node technology, S will preferably be less than 15 nm, typically 7-15 nm. For 14 nm node technology, S will preferably be less than 10 nm, typically 5-10 nm. S is smaller than the minimum feature size for each technology node allows. In the space (S) between the spacers of adjacent fuse gates 60 is the fuse 70. The advantage of having a sub-lithographic space is that the fuse will be narrow, thus having a higher current density which will facilitate blowing the fuse. In addition, the fuse 70 of the present invention is the same narrow width along all portions, meaning it is the same narrow width at the fuse contact 74 and the fuse line 72. That is in contrast to FIG. 1 in which the pad portions 15 are wider than the link portion 25. The present inventions uniform narrow width increases current density which aids in fuse blow. In addition, the narrow width of the fuse contact 74 of the integrated fuse 70 consumes less real estate than a conventional fuse, which is important as devices continually shrink while device density increases.

Figure 2B:
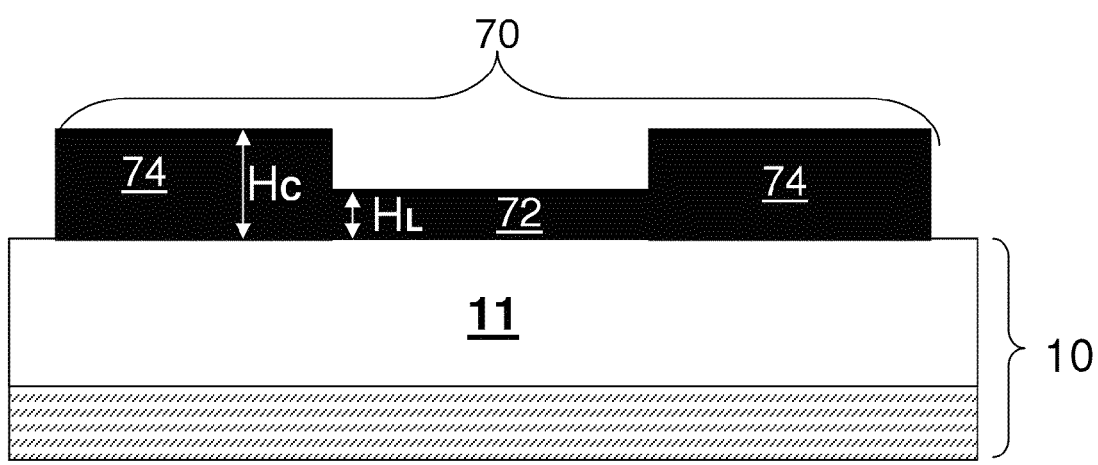
FIG. 2B illustrates a cross-section through the e-fuse of FIG. 2A along line B-B according to an embodiment of the present invention.

The line B-B in FIG. 2A denotes a cross-section of fuse parallel to the fuse 70 which is illustrated in FIG. 2B. Referring to FIG. 2B, the fuse 70 has two distinct areas, a central fuse link 72 and fuse contact 74 regions. The two areas are integrated, meaning they are the same material, connected and preferably formed during the same deposition process, as will be discussed later. This is contrast to a typical fuse of FIG. 1 in which the contact 30 was a separate material from the fuse 5.

Still referring to FIG. 2B and the two areas of the fuse 70, namely, fuse link 72 and fuse contact 74, the height ($H_L$) of the fuse link 72 is less than the height ($H_C$) of the fuse contact 74. This is in contrast to a typical fuse of FIG. 1 in which the fuse's link portion 25 and wide pad portion 15 are the same height. The reduced height of the fuse link 72 increases current density to facilitate blowing of the fuse 70. The fuse link height ($H_L$) can be from about 10% to about 90%, and typically from about 30% to about 60% of the fuse contact height ($H_C$). The fuse contact height ($H_C$) will preferably be about equal to the fuse gate height as will be seen in FIG. 2C.

Continuing to refer to FIG. 2B, the fuse 70 is above the isolation area 11 which is formed in (for example, a shallow trench isolation) or on substrate 10. Preferably, substrate 10 is a semiconductor material which is the same as the active area 12. The substrate 10 may be a bulk substrate or a silicon on insulator substrate (SOI).

Figure 2C:
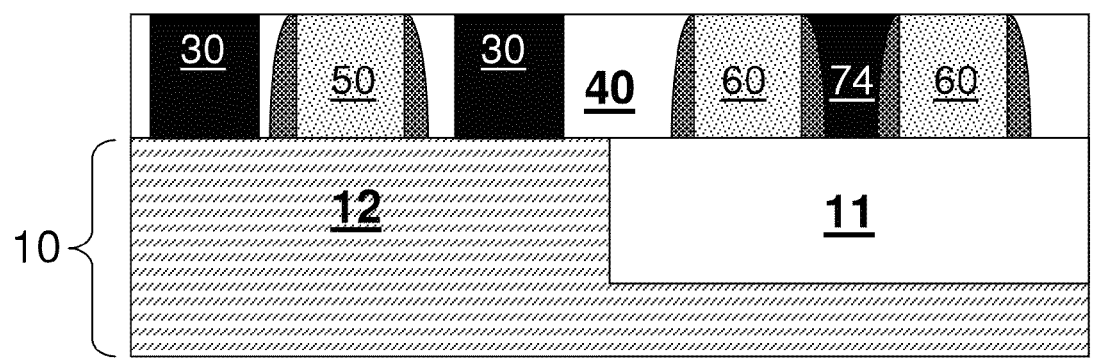
FIG. 2C illustrates a cross-section through the e-fuse of FIG. 2A along line C-C according to an embodiment of the present invention.

The line C-C in FIG. 2A denotes a cross-section of active region and fuse region which is illustrated in FIG. 2C. Referring to FIG. 2B the left-hand shows an active region having contacts 30 to a source and drain (not explicitly shown) and gate 50. On the right hand side, is the fuse region above the isolation 11. The fuse region in this cross-section shows the fuse contact 74 between the spacers of adjacent fuse gates 60. The height (HO of the fuse contact 74 is such that the fuse contact is co-planar with the fuse gates 60. The height allows easy connection of the fuse with control wiring and easy manufacturing with the active regions as will be explained later.

Figure 2D:
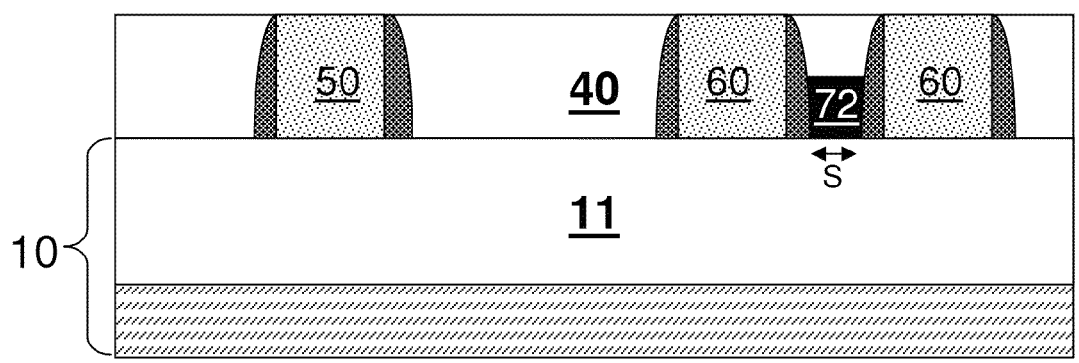
FIG. 2D illustrates a cross-section through the e-fuse of FIG. 2A along line D-D according to an embodiment of the present invention.
Figure 3A:
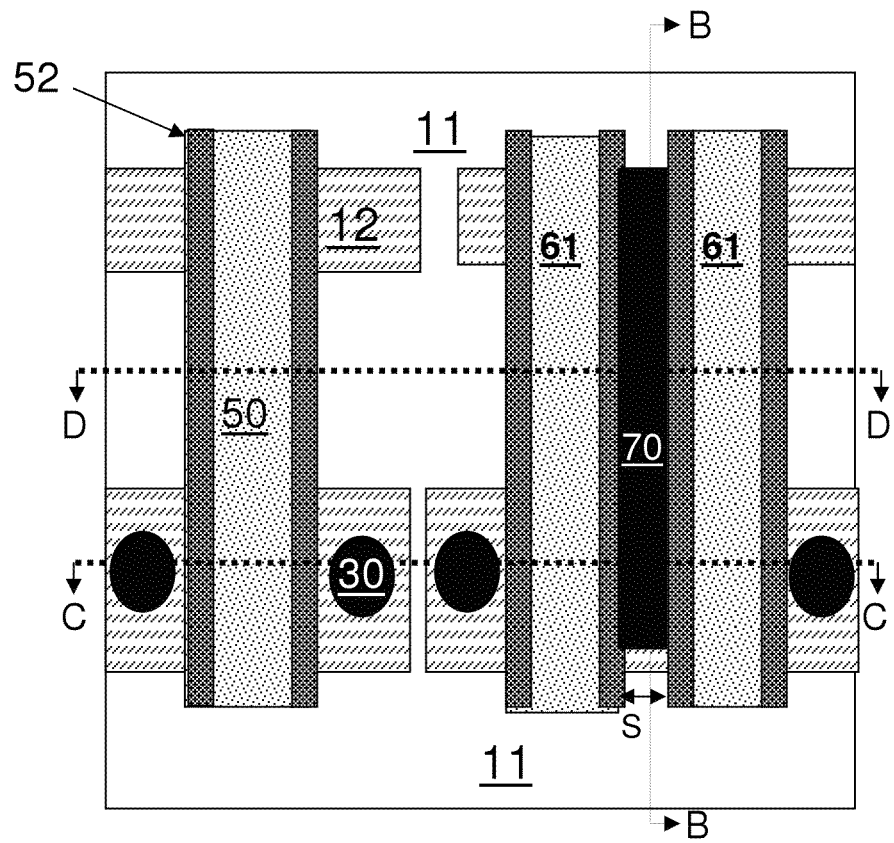
FIG. 3A illustrates a top down view of a substrate having a device area and an e-fuse according to another embodiment of the present invention.
Figure 3B:
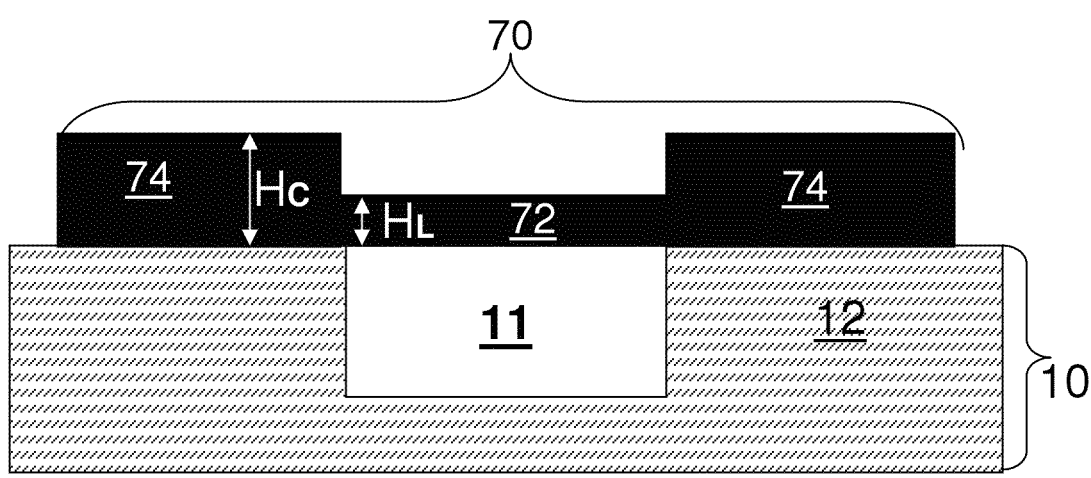
FIG. 3B illustrates a cross-section through the e-fuse of FIG. 2A along line B-B according to another embodiment of the present invention.
Figure 3C:
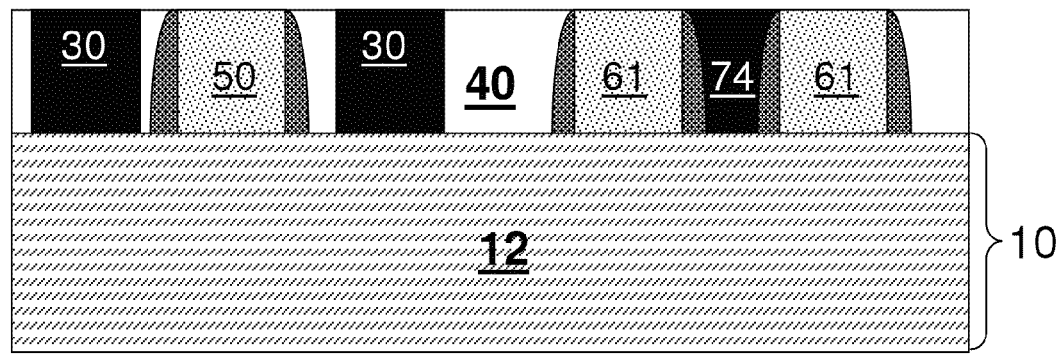
FIG. 3C illustrates a cross-section through the e-fuse of FIG. 2A along line C-C according to another embodiment of the present invention.
Figure 3D:
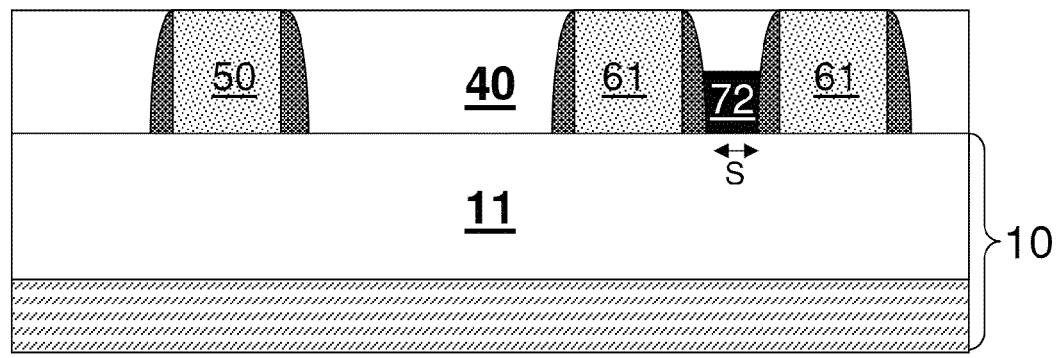
FIG. 3D illustrates a cross-section through the e-fuse of FIG. 2A along line D-D according to another embodiment of the present invention.

The line D-D in FIG. 2A denotes a cross-section of the fuse region which is illustrated in FIG. 2D. Referring to FIG. 2D, the right hand side shows the fuse region above the isolation 11. The fuse region in this cross-section shows the fuse link 72 between the spacers of adjacent fuse gates 60. The height ($H_C$) of the fuse link 72 is less than the fuse gates 60. The location of the fuse link 72 above the isolation area 11 intensifies heating of the fuse and further facilitates blowing of the fuse. Thus, at least three features of the fuse link 72 make is easier to blow than normal fuses, first the reduced height compared to other conducting features at the same level, the narrow (preferably sub-lithographic) width, and the increased heating by being over an insulating isolation region 11 as opposed to a semiconductor region.

FIGS. 3A-3D show another embodiment of the e-fuse structure of the present invention. Here, the main difference is the location of the isolation region 11 and active region 12 relative to the fuse 70. In particular, the entire fuse 70 is no longer over isolation region 12. Instead, a portion of the fuse is over semiconductor 12. There may be contacts 30 associated with this semiconductor region, too. The two gates 61 of the fuse region function as control gates to program fuse link and thus are active gates. In addition, contacts associated with the gates 61 connect to current resource. Gate 50 could be integrated for other circuits. While the location of the isolation 12 relative to the fuse 70 may vary, in a preferred embodiment at least a portion of the fuse link 72 is above and in contact with the isolation 12. Another difference which may occur in the embodiment pictured in FIGS. 3A-3D, is that the gate 61 which helps to confine and define the self-aligned width of the fuse 70 is no longer a dummy gate, but can be an active gate used to program the fuse 70.

Figure 4:
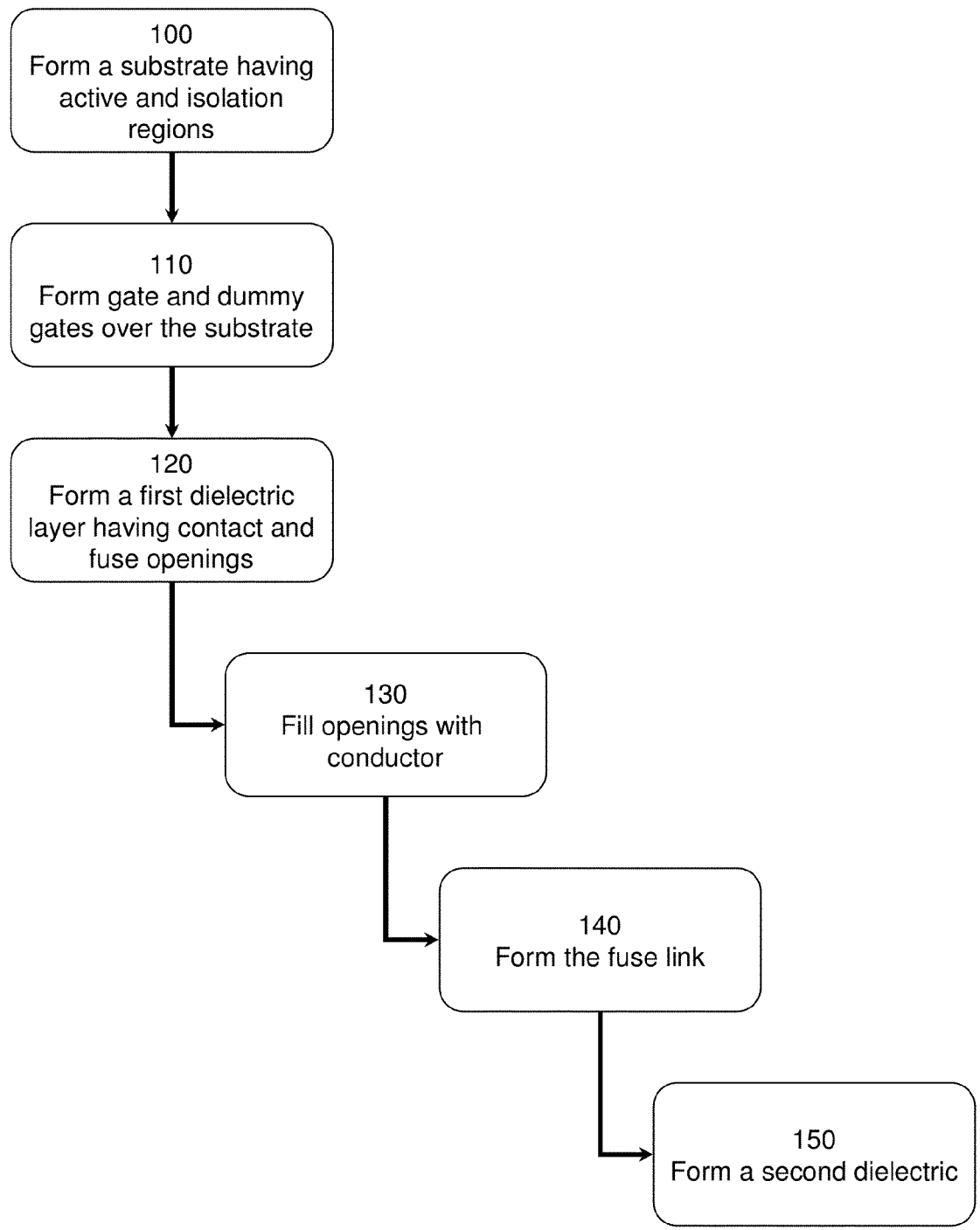
FIG. 4 illustrates a flow chart for making an e-fuse according to an embodiment of the present invention.

Referring to FIG. 4 an embodiment of a method of forming an e-fuse with various embodiments of the present invention given in a flow chart. At step 100 a substrate having active and isolation regions is formed. At step 110 gates and fuse gates are formed over the substrate. At step 120 a first dielectric layer is formed over the substrate and openings for the contacts and fuse are made in the dielectric. At step 130 the contact and fuse openings are filled with a conductor. At step 140 the fuse link is formed. At step 150 a second dielectric is formed.

Figure 5A:
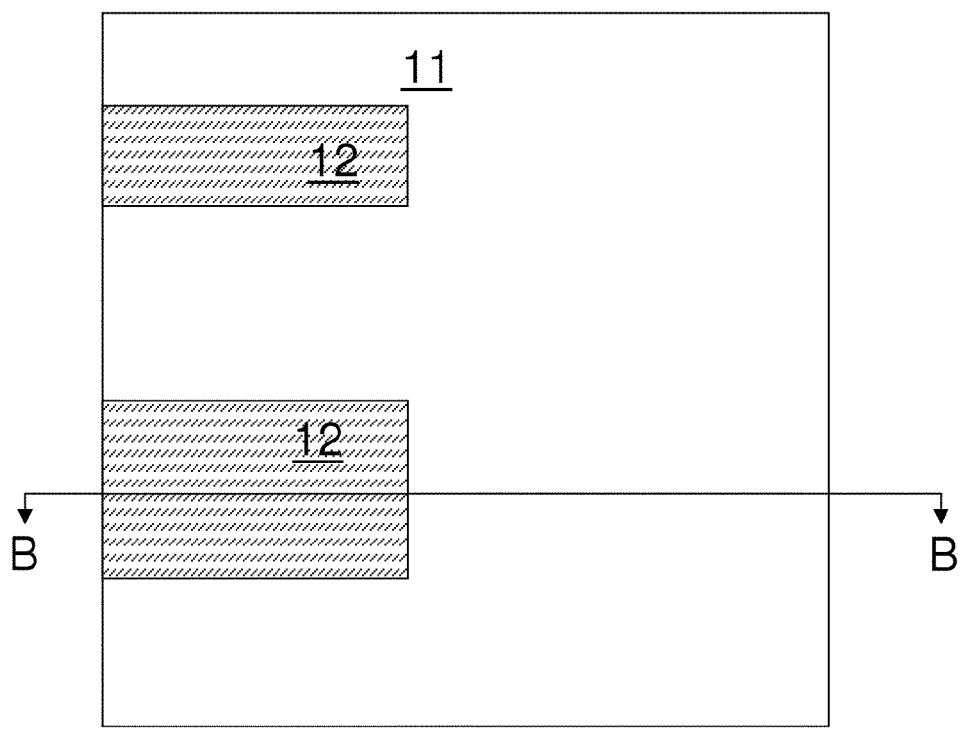
FIG. 5A illustrates a top down view of a substrate after forming active and isolation regions according to an embodiment of the present invention.
Figure 5B:
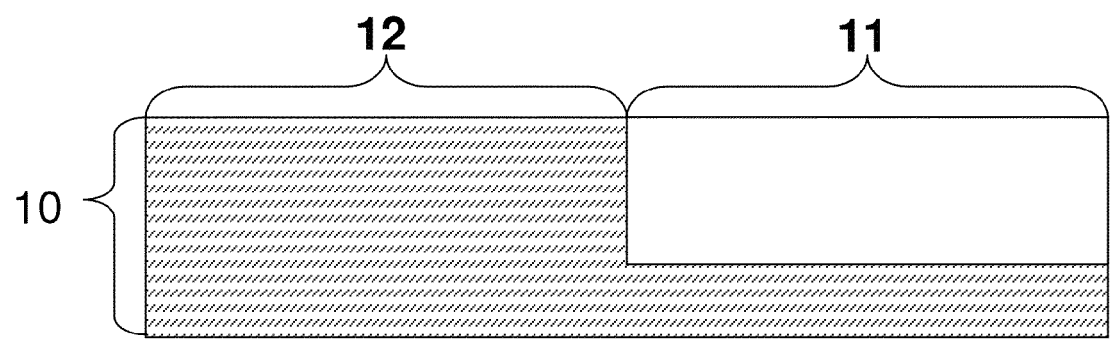
FIG. 5B illustrates a cross-section through the e-fuse of FIG. 5A along line B-B according to another embodiment of the present invention.

Referring to FIG. 5A a top down view of the substrate having active areas 12 and isolation areas are shown. The active 12 and isolation 11 areas may have a variety of shapes and proportions. Active areas 12 are those areas comprising a semiconductor and upon which devices such as transistors are formed. In most cases, the active area includes the semiconductor of the bulk substrate 10. Isolation areas 11 comprise insulating material which separates active areas from each other. A common embodiment of an isolation area 11 is a shallow trench isolation (STI). As the name implies, a shallow trench is formed in the substrate 10 and filled with one or more insulating layers, usually silicon dioxide. FIG. 5B shows a cross-section of FIG. 5A through line B-B. Here, a shallow trench embodiment of an isolation area 11 is shown on substrate 10 which includes active area 12.

Figure 6A:
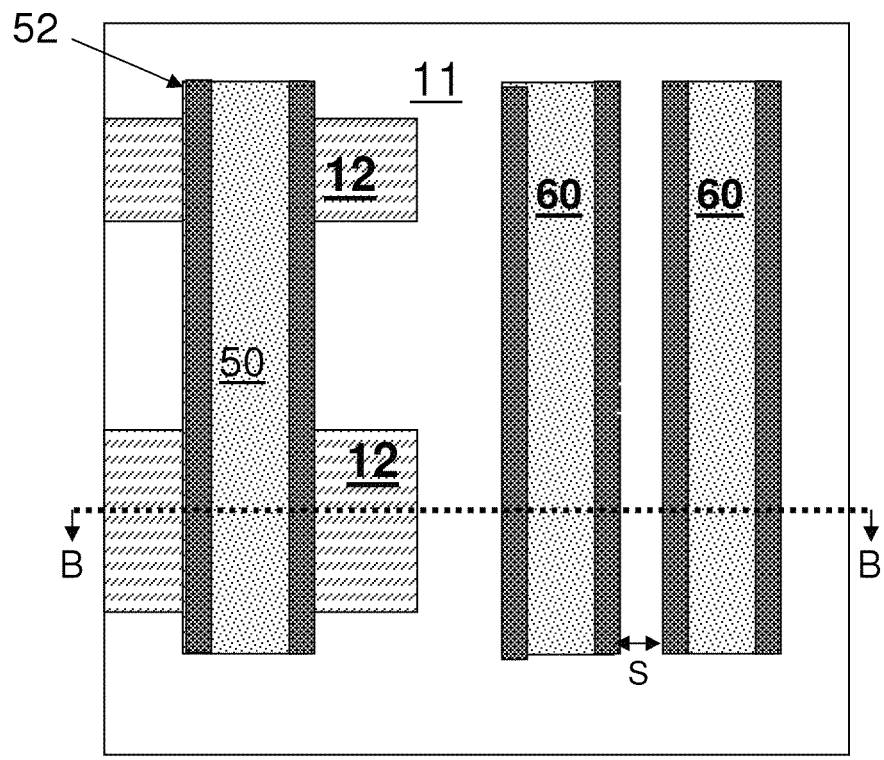
FIG. 6A illustrates a top down view of a substrate after forming a gate and fuse gates according to an embodiment of the present invention.
Figure 6B:
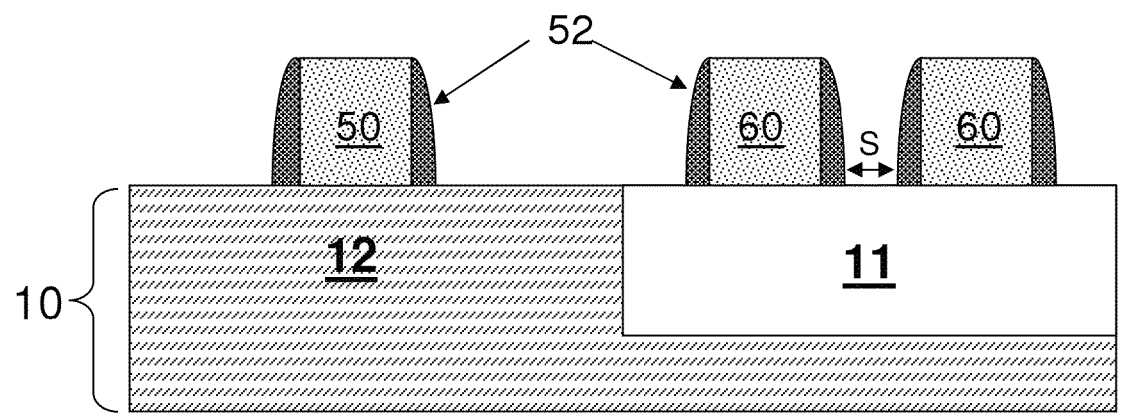
FIG. 6B illustrates a cross-section through the e-fuse of FIG. 6A along line B-B according to another embodiment of the present invention.

Referring to FIG. 6A a top down view after format\ion of gate 50 and fuse gates 60 is shown. Gate 50 crosses over active area 12. Though not specifically shown here, source and drain regions are formed in the active area 12 on either side of gate 50. On the right, a pair of adjacent fuse gates 60 are formed over at least a portion of the isolation area 11. Both gate 50 and fuse gates 60 have spacers 52 formed on either side of them. The result is that a space (s) is formed between the adjacent fuse gates 60. In a preferred embodiment, the fuse gates have minimum resolution allowed by the lithography for that node, therefore, the addition of spacers 52, makes the space (s) smaller than achievable by lithography alone and thus is sub-lithographic as explained earlier.

Figure 7A:
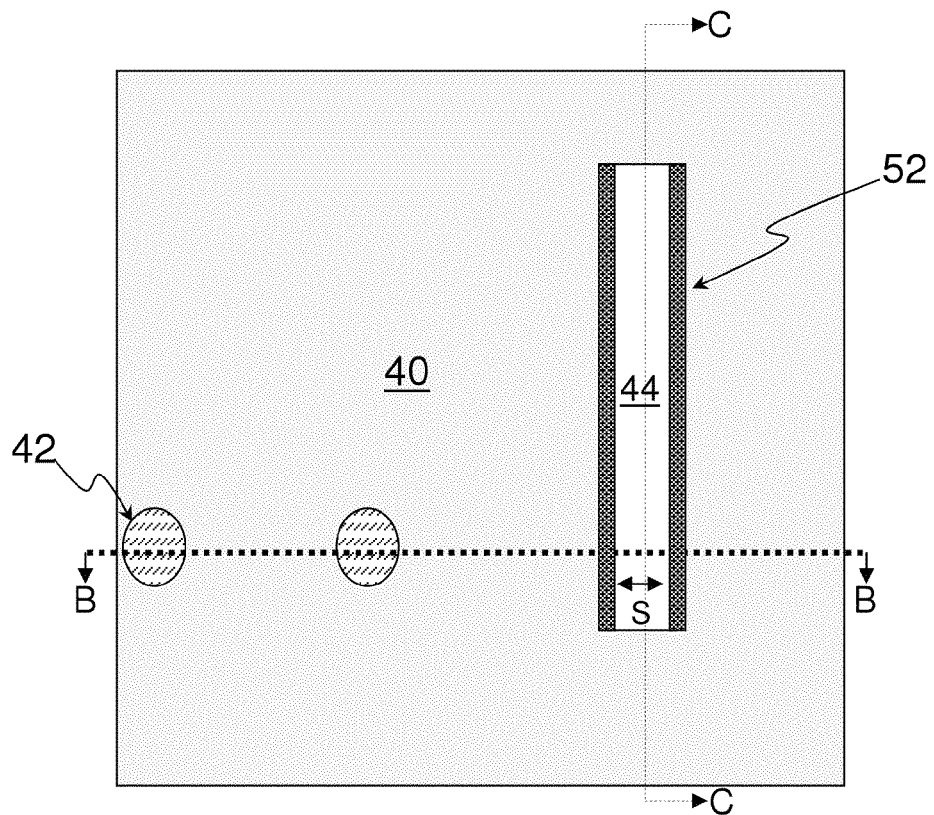
FIG. 7A illustrates a top down view of a substrate after forming a first dielectric having contact and fuse openings according to an embodiment of the present invention.
Figure 7B:
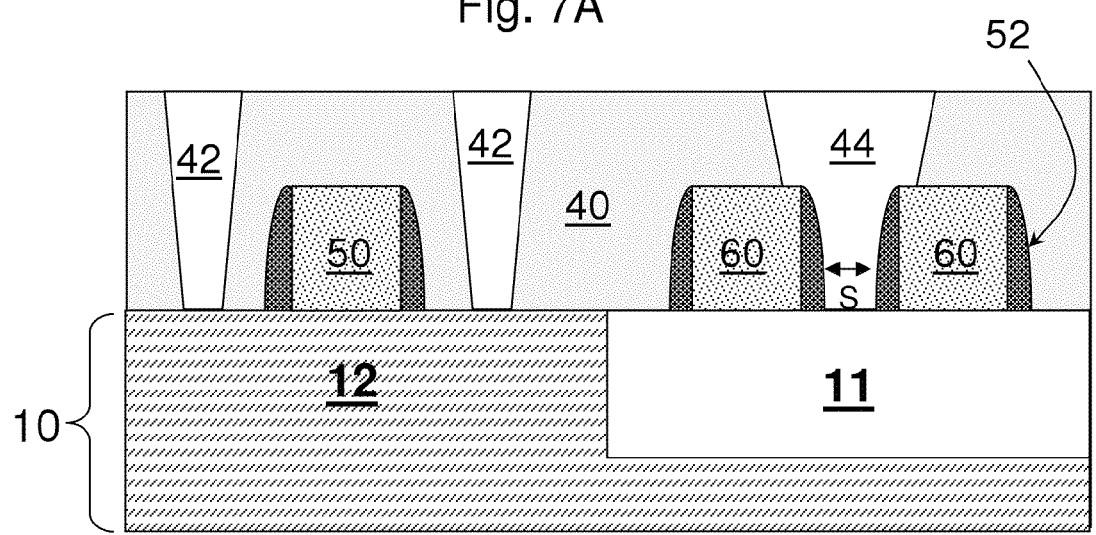
FIG. 7B illustrates a cross-section through the e-fuse of FIG. 7A along line B-B according to another embodiment of the present invention.
Figure 7C:
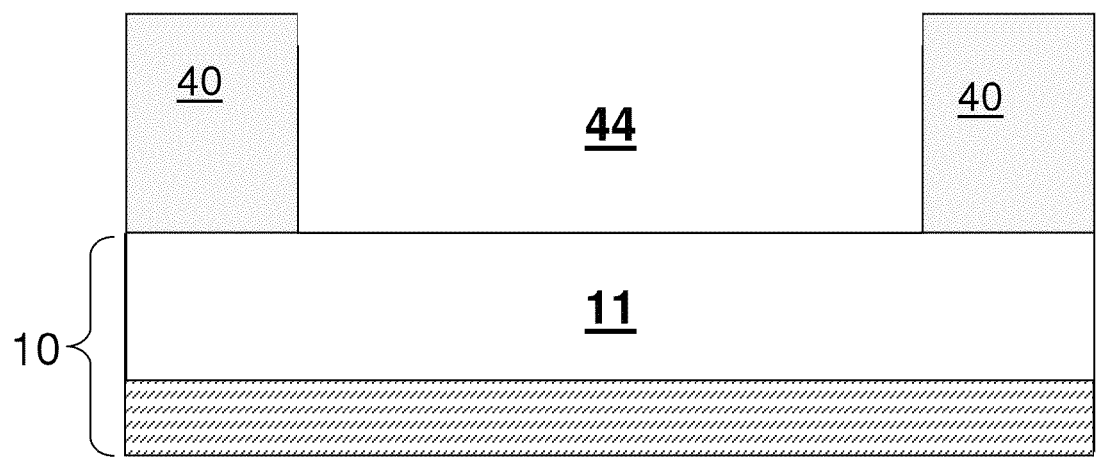
FIG. 7C illustrates a cross-section through the e-fuse of FIG. 7A along line C-C according to another embodiment of the present invention.

Referring to FIG. 7A a top down view after depositing a first dielectric 40 and forming openings (contact 42 and fuse 44, respectively). The first dielectric 40 may be one or more of the MOL dielectrics described earlier. The contact openings 42 land on active area 12, specifically on a source/drain area not shown in the figures. The fuse opening 44 is between and along the spacers 52 of the fuse gates and reaches the substrate 10, and more specifically, at least a portion of the isolation area 11 of the substrate is exposed by the fuse opening 44. Typically, the first dielectric will be doped or undoped oxide and the spacers 52 will include a nitride layer, thus the fuse opening 44 will naturally form between the spacers due to the etch rate difference between the oxide and nitride. In that way, in the next step, the fuse material will be self-aligned in the space ("s") between the fuse gates 60. FIG. 7B is a cross-section along the line B-B in FIG. 7A which further illustrates the self-aligned nature of the fuse opening 44 relative to the fuse gates 60, their spacers 52 and space (s). FIG. 7C is a cross-section along line C-C of FIG. 7A.

Figure 8A:
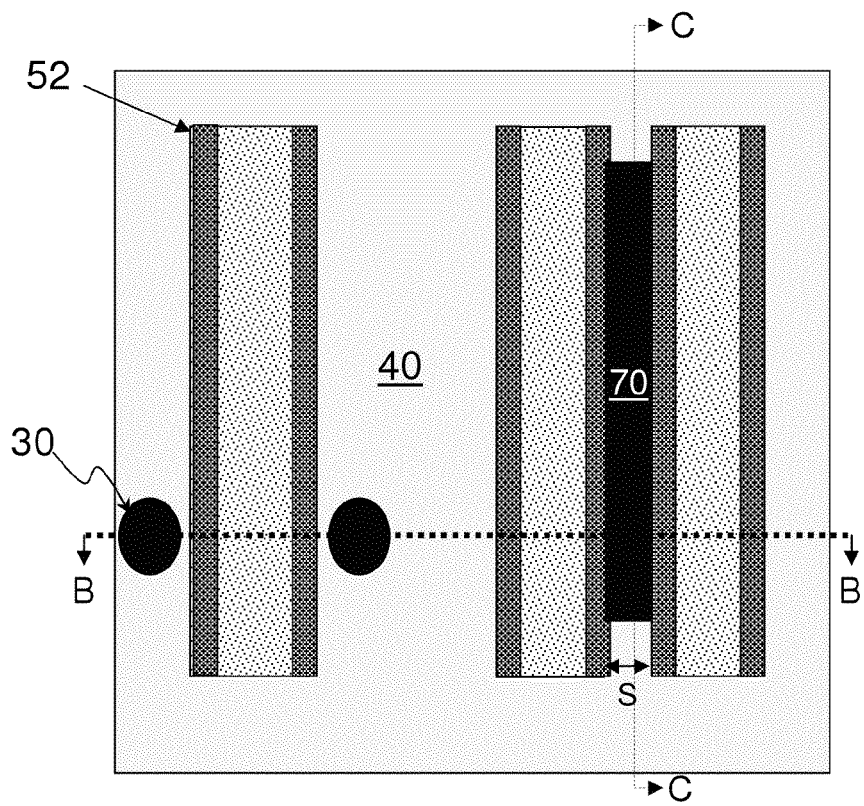
FIG. 8A illustrates a top down view of a substrate after depositing contacts and fuse material according to an embodiment of the present invention.
Figure 8B:
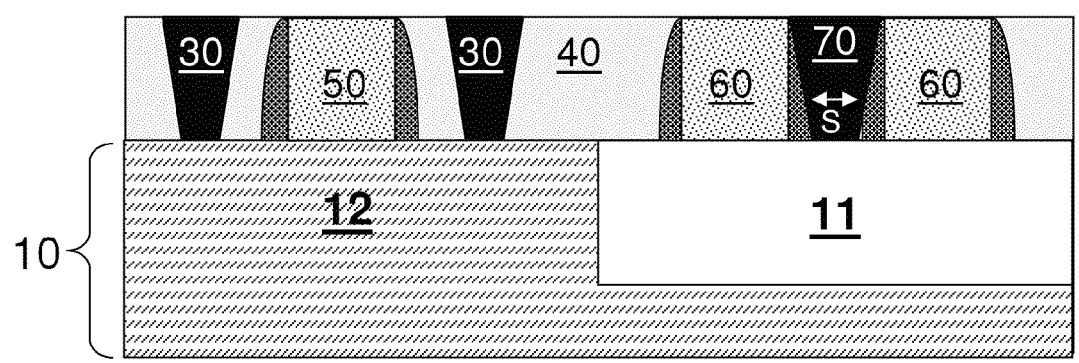
FIG. 8B illustrates a cross-section through the e-fuse of FIG. 8A along line B-B according to another embodiment of the present invention.
Figure 8C:
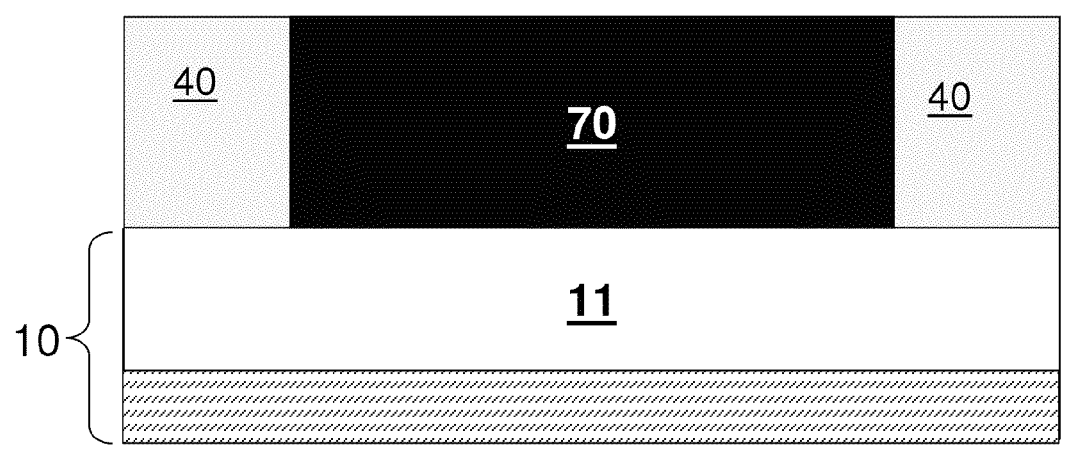
FIG. 8C illustrates a cross-section through the e-fuse of FIG. 8A along line C-C according to another embodiment of the present invention.

Referring to FIG. 8A a top down view after depositing and planarizing a metal to form the contacts 30 and fuse 70. In a preferred embodiment, the metal is a refractory metal and may include one or more liners which function as adhesion and/or barrier layers. In a preferred embodiment the metal of the contacts and fuse is a Ti/TiN liner filled with tungsten. However any conductor or combination of conductors suitable for contacts may be used. FIG. 8B is a cross-section along the line B-B in FIG. 8A which further illustrates the self-aligned nature of the fuse opening 44 relative to the fuse gates 60, their spacers 52 and space (s). FIG. 8C is a cross-section along line C-C of FIG. 8A.

Figure 9A:
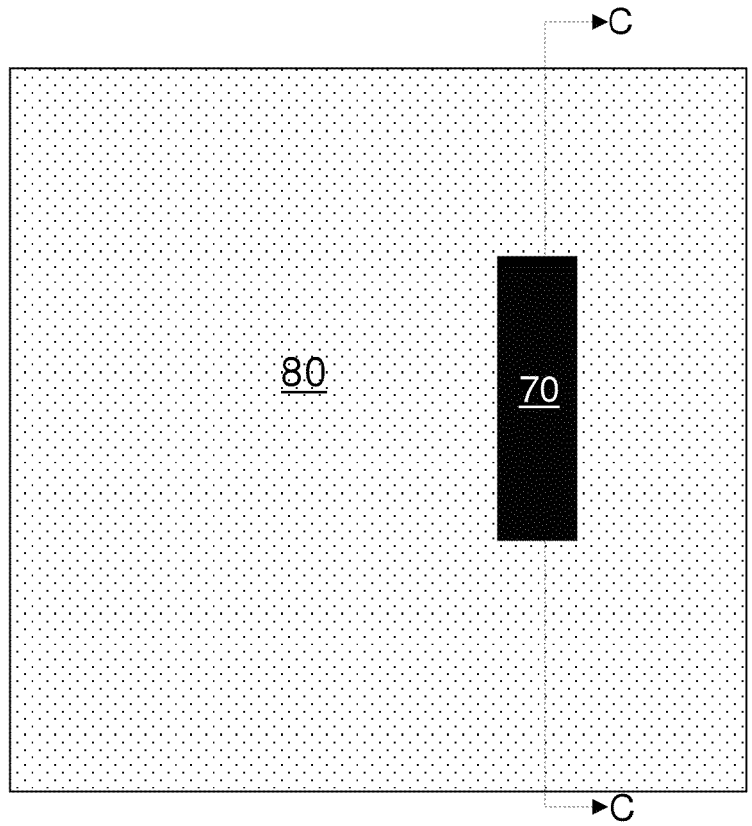
FIG. 9A illustrates a top down view of a substrate after forming a patterned photoresist according to an embodiment of the present invention.
Figure 9B:
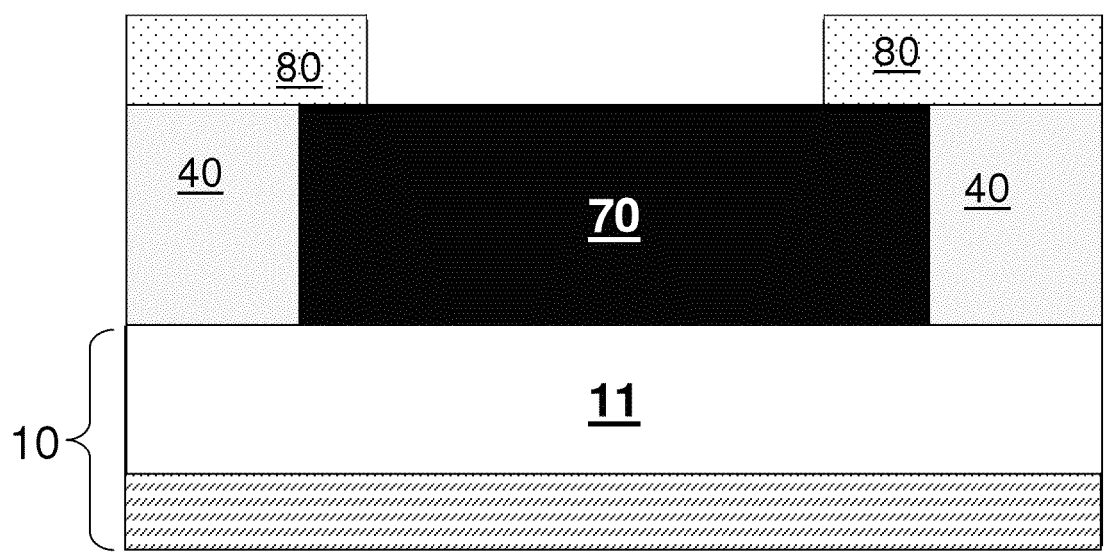
FIG. 9B illustrates a cross-section through the e-fuse of FIG. 9A along line C-C according to another embodiment of the present invention.

Referring to FIG. 9A a top down view after forming a patterned photoresist 80. The patterned photoresist 80 has an opening over a portion of the fuse 70 which will become a thinned portion of the fuse link 72 after a subsequent etch and thus yield FIGS. 2A-2D. FIG. 9B is a cross-section along the line C-C in FIG. 9A which further illustrates the location of the photoresist opening according to the pictured embodiment. When the fuse 70 material is tungsten a combination of $HF:HNO_3$ could be used for fast etching and aqua regia for fine etching.

Figure 10A:
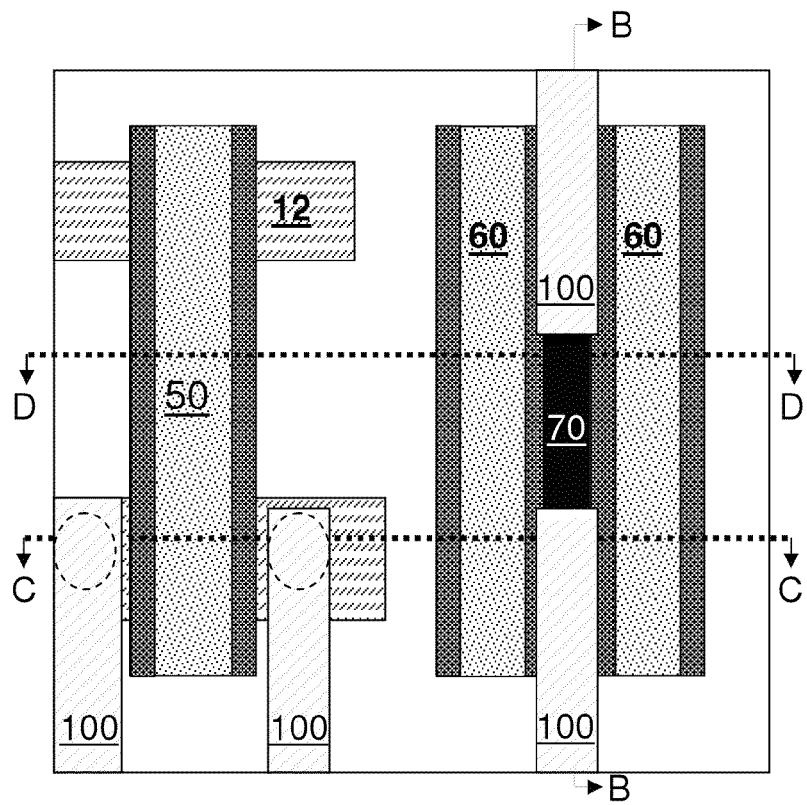
FIG. 10A illustrates a top down view of a substrate forming wiring according to embodiment of the present invention.
Figure 10B:
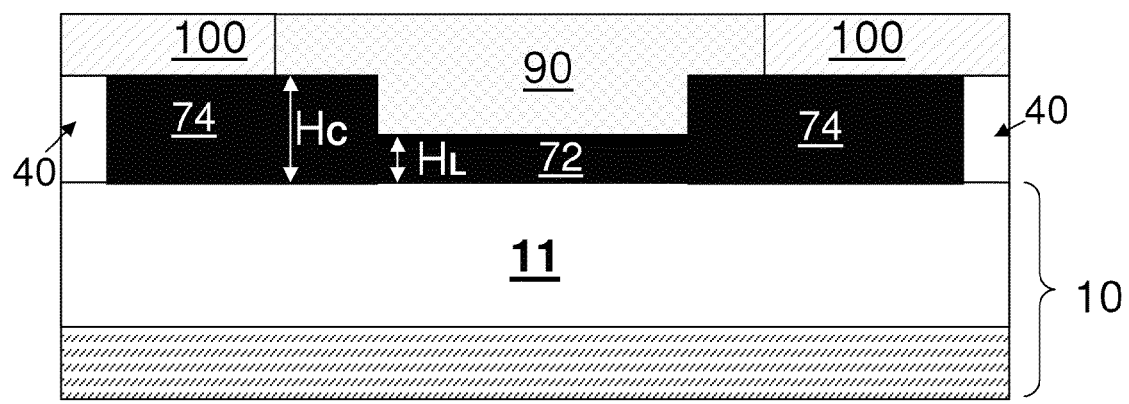
FIG. 10B illustrates a cross-section through the e-fuse of FIG. 10A along line B-B according to another embodiment of the present invention.
Figure 10C:
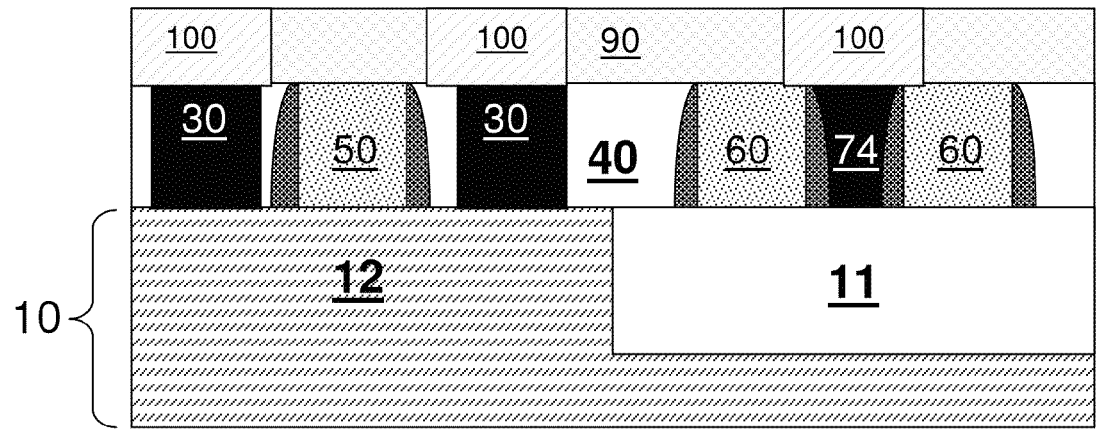
FIG. 10C illustrates a cross-section through the e-fuse of FIG. 10A along line C-C according to another embodiment of the present invention.
Figure 10D:
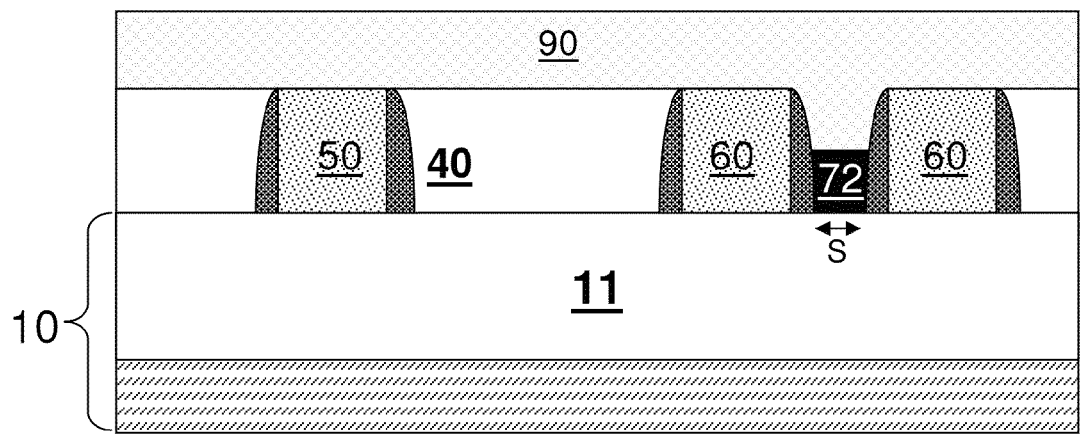
FIG. 10D illustrates a cross-section through the e-fuse of FIG. 10A along line D-D according to another embodiment of the present invention.
Figure 11A:
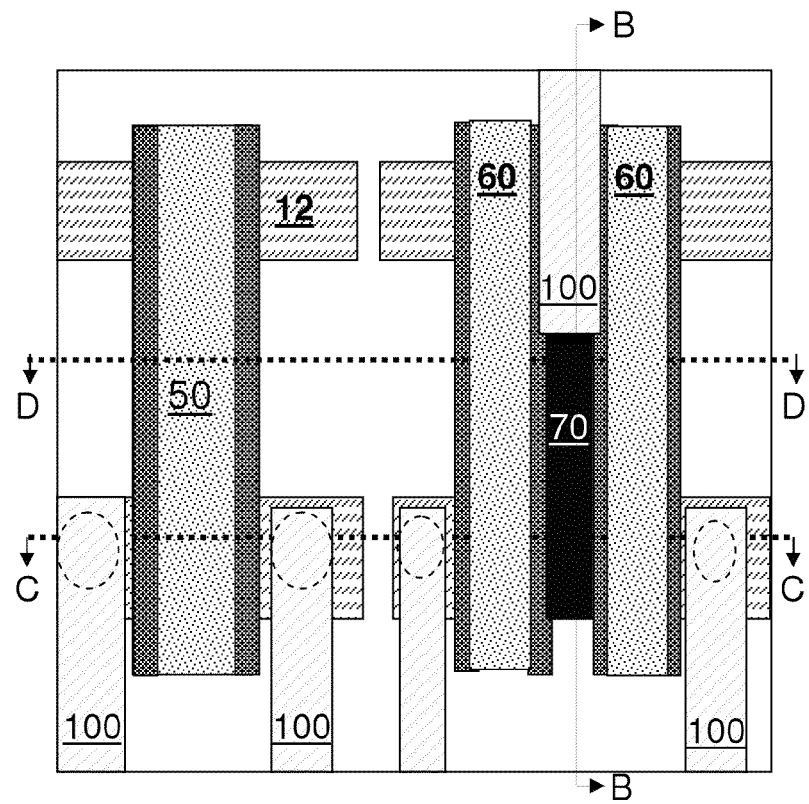
FIG. 11A illustrates a top down view of the another embodiment of FIG. 3A after forming wiring according to another embodiment of the present invention.
Figure 11B:
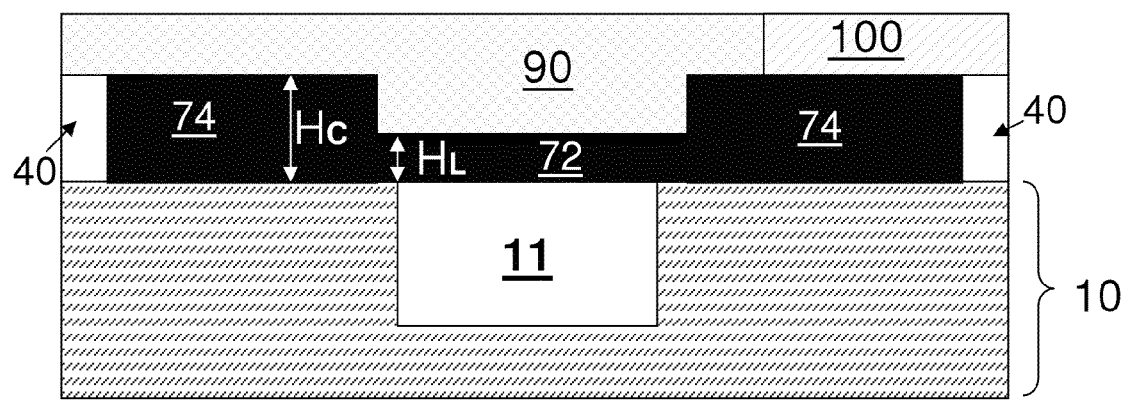
FIG. 11B illustrates a cross-section through the e-fuse of FIG. 11A along line B-B according to another embodiment of the present invention.
Figure 11C:
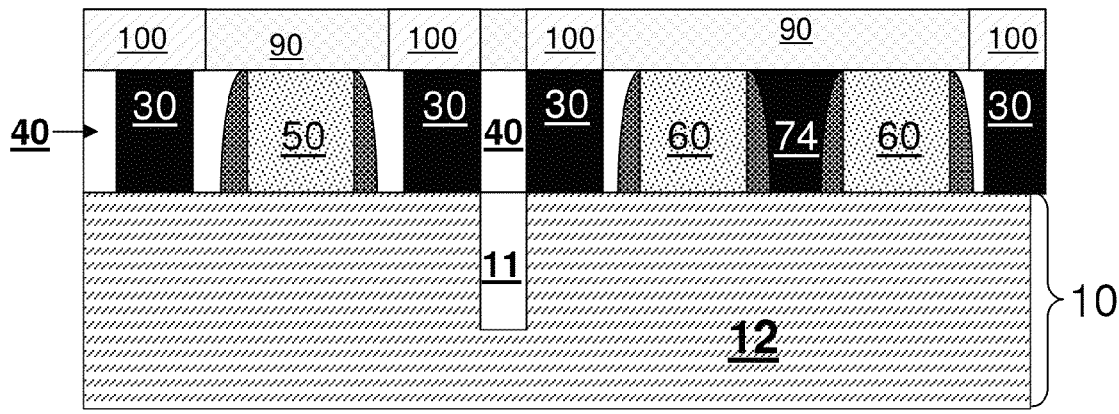
FIG. 11C illustrates a cross-section through the e-fuse of FIG. 11A along line C-C according to another embodiment of the present invention.
Figure 11D:
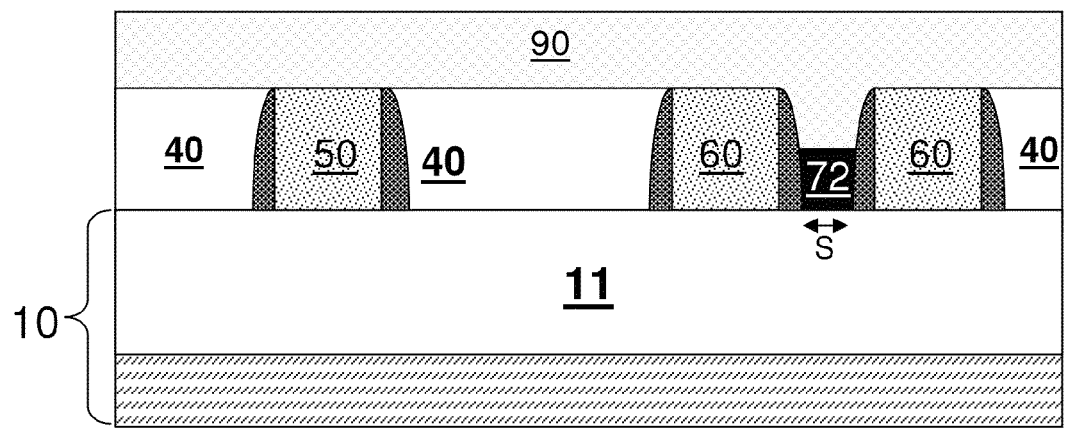
FIG. 11D illustrates a cross-section through the e-fuse of FIG. 11A along line D-D according to another embodiment of the present invention.

Referring to FIG. 10A a top down view after forming wiring 100 to the active device contacts 30 and the integrated fuse contact 74 of fuse 70. FIG. 10B is a cross-section along the line B-B in FIG. 10A which further illustrates the location of the wiring 100 relative to the fuse contact 74 according to an embodiment. Here, in cross section the dielectric layers including first dielectric 40 and second dielectric 90 can be seen. Likewise FIG. 10B is a cross-section along the line B-B in FIG. 10A and FIG. 10D is a cross-section along the line DD in FIG. 10A.

Similar to the FIG. 10 series, the FIG. 11 series of illustrations shows top down and cross-section views of the embodiment of FIGS. 3A-3D having wiring 100. Specifically, in this embodiment, the fuse contact 74 is over an active area 12 of the substrate. Therefore, the dummy gates 60, in this embodiment can actually be active gates. Thus, they form part of the programming FET of the fuse 70 along with contacts 30 on either side of the gates 60. Therefore, in this embodiment, the gates 60 server two purposes, namely, a functional active gate of a transistor and a boundary for the self-aligned fuse 70. Wiring 100 over the fuse contact 74 may serve as a fuse anode.

An exemplary tungsten fuse 70 in accordance with the present invention will advantageously blow because the narrow and short fuse link 72 will heat in the dielectric blanket (isolation region 11, spacers 52 and second dielectric 90) surrounding it causing a thermal runaway process even at low programming current (for example 6-10 mA) as is illustrated in the table below:

TABLE 1

Exemplary Tungsten Fuse

| Physical Properties | | E-Fuse Parameters | |
|---|---|---|---|
| Material | Tungsten | Fuse Width | 10 nm |
| Resistivity at room temperature | 5.08E−08 ohm * m | Fuse Link (72) height | 50 nm |
| Resistivity at melting point | 5.08E−07 ohm * m | Fuse Link (72) Length | 400 nm |
| Melting Point | 3422 C. | Fuse Link (72) resistance | 4.64E+01 |
| | | Current Required | ~6 mA |

This concludes the description of a self-aligned integrated fuse compatible with normal contact processing with uniform, preferably sub-lithographic width and methods to make the same. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A fuse comprising:
   a substrate having an isolation region;
   a pair of adjacent fuse gates having spacers which create a spacing between the adjacent fuse gates; and
   an integrated fuse link and fuse contact located in the spacing;
      wherein the fuse contact directly touches an upper level metal line;
      wherein the fuse link has a link height and wherein the fuse contact has a contact height;
      wherein the link height is less than the contact height;
      wherein the fuse link and fuse contact have the same width;
      wherein at least a portion of the fuse link is over and in direct contact with the isolation region.

2. The structure of claim 1 wherein the integrated fuse link and fuse contact comprise a refractory metal.

3. The structure of claim 2 wherein the refractory metal includes tungsten.

4. The structure of claim 1 wherein the fuse contact height is equal to a height of at least one of the fuse gates.

5. The structure of claim 1 wherein the fuse contact is co-planar with at least one of the fuse gates.

6. The structure of claim 1 wherein the spacing is sub-lithographic.

7. The structure of claim 1 wherein the spacing is from about 5 nm to about 30 nm.

8. The structure of claim 1 wherein the height of the fuse link is less than or equal to about 90% of the height of the fuse contact.

9. The structure of claim 1 wherein the height of the fuse link is from about 5 nm to about 50 nm.

10. The structure of claim 1 wherein the fuse link has been programmed to form a void in the fuse link.

11. The structure of claim 1 wherein the pair of fuse gate are active gates.

12. The structure of claim 11 wherein the fuse contact is over and in contact with an active region of a substrate.

13. The structure of claim 1 wherein the pair of fuse gates are dummy gates.

14. The structure of claim 13 wherein the fuse contact is over and in contact with the isolation region.

\* \* \* \* \*